United States Patent [19]

Essig

[11] Patent Number: 5,105,533
[45] Date of Patent: Apr. 21, 1992

[54] MOUNTING HEAD

[75] Inventor: Bernhard Essig, Riesbuerg/Goldburghausen, Fed. Rep. of Germany

[73] Assignee: SES Electronics GmbH, Noerdlingen, Fed. Rep. of Germany

[21] Appl. No.: 466,097

[22] Filed: Jan. 16, 1990

[30] Foreign Application Priority Data

Apr. 1, 1989 [DE] Fed. Rep. of Germany ....... 8904031

[51] Int. Cl.$^5$ .............................................. B23P 19/04
[52] U.S. Cl. .................................... 29/741; 29/759
[58] Field of Search ............... 29/33 M, 837-839, 29/739, 741, 759, 748, 751, 753, 857, 861, 863; 414/225; 294/2; 901/18, 39, 40

[56] References Cited

U.S. PATENT DOCUMENTS

| 4,558,514 | 12/1985 | Scrantom | 29/741 |
| 4,610,473 | 9/1986 | Hawkswell | 294/2 X |
| 4,627,785 | 12/1986 | Monforte | 294/2 X |
| 4,628,594 | 12/1986 | Yamagami et al. | 29/741 |
| 4,718,165 | 1/1988 | Reuss | 29/741 X |
| 4,736,517 | 4/1988 | Wright et al. | 29/741 |
| 4,753,004 | 6/1988 | Fujioka | 294/2 X |
| 4,815,202 | 3/1989 | Jackson et al. | 29/741 |

FOREIGN PATENT DOCUMENTS 3509803 9/1986 Fed. Rep. of Germany ........ 901/18

Primary Examiner—Larry Schwartz
Assistant Examiner—Robert Schultz
Attorney, Agent, or Firm—Pascal & Associates

[57] ABSTRACT

A mounting head for fitting a socket with an electronic component comprising a mounting tongue located between two jaws having at least one intake port for holding a component, a first lifting device for shifting the mounting torque between the two jaws in a first direction, a first supporting headpiece for the jaws which is movable in the first direction toward the socket until the jaws come to rest against the socket after which the tongue may be shifted in the direction of the socket, a centering plate extending transversely to the jaws retained on a first headpiece together with the jaws and tongue, the headpiece being comprised of the first lifting device, the first headpiece being supported by a second headpiece which is situated at the side of the centering plate, the second headpiece being comprised of a second lifting device for shifting the first headpiece transversely to the centering plate and transversely to the first direction.

21 Claims, 1 Drawing Sheet

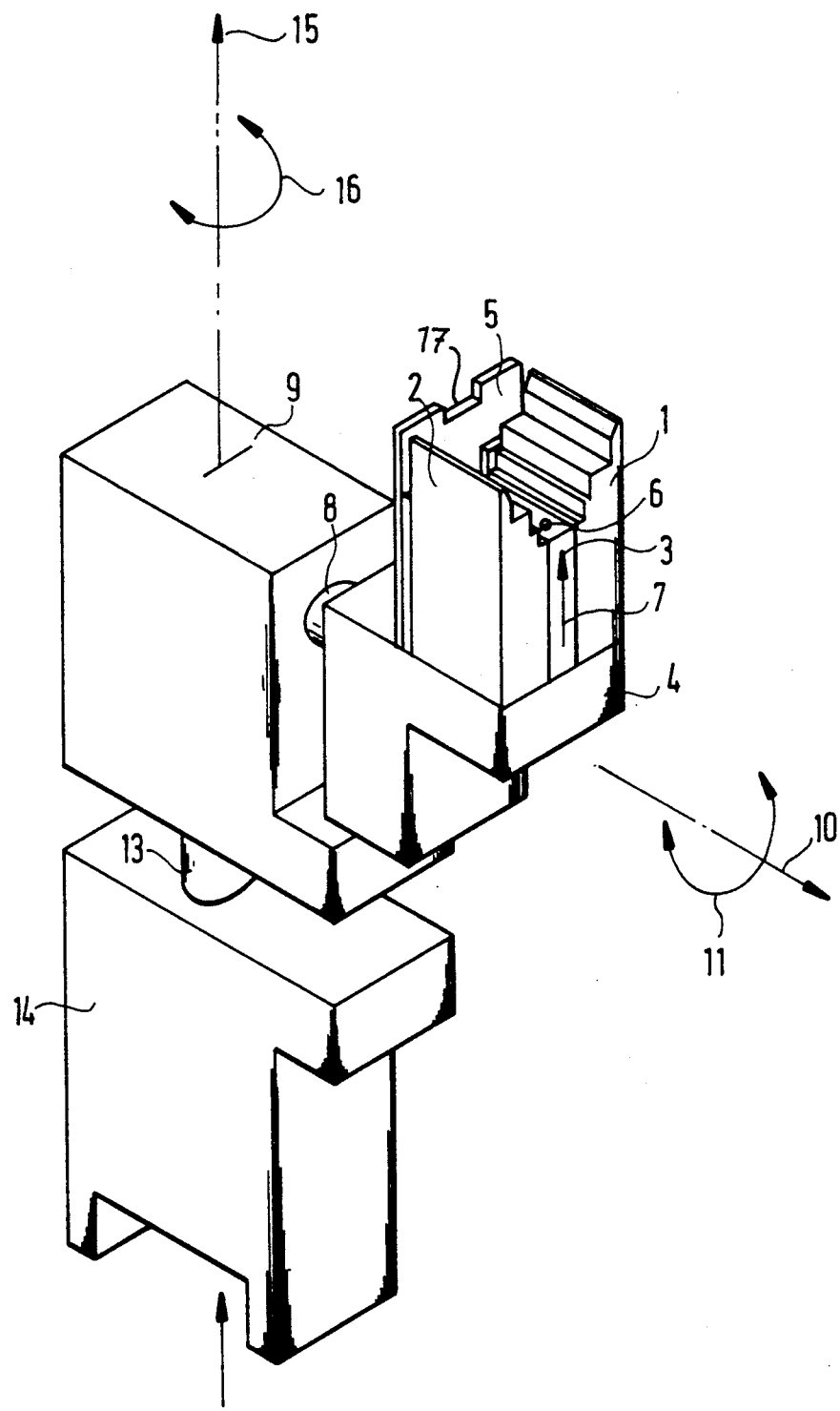

MOUNTING HEAD

This invention relates to a mounting head for fitting sockets with electronic components of the type having a mounting tongue having at least one intake port for holding an electronic component.

The above type of a mounting head is, for example, described in German GM 86 34 001. In that design, the mounting head has two jaws which are arranged on a support. A component mounting tongue can be moved back and forth between the jaws by means of a pneumatic cylinder fastened to the support. The support is moved by an additional pneumatic cylinder in the direction of a socket until the jaws come to rest against the socket. As a result of this, the socket is expanded and the mounting tongue, which carries an electronic component, is then moved in the direction of the socket and is clamped there when the support retracts. A spring is located between the support and the pneumatic cylinder moving the support.

Numerous sockets located in a row can be fitted with electronic components with a mounting head of this type, whereby the plate carrying the sockets is gradually moved past along the mounting head.

If individual sockets are not perfectly positioned relative to the mounting head, there is a danger that the components will not be held or will not be held correctly in position by this kind of a socket. The reason for this incorrect positioning can be, on one hand, that a socket is not correctly fastened to a plate or, on the other hand, that the pace at which the plate is moved along the mounting head varies.

It is an object of the present invention to construct the mounting head in such a way that it automatically positions itself relative to the socket.

A preferred embodiment of the invention is a mounting head for fitting a socket with an electronic component comprising a mounting tongue located between two jaws having at least one intake port for holding a component, a first lifting device for shifting the mounting tongue between the two jaws in a first direction, a first suporting headpiece for the jaws which is movable in the first direction toward the socket until the jaws come to rest against the socket, after which the tongue may be shifted in the direction of the socket, a centering plate extending transversely to the jaws and tongue, the headpiece being comprised of the first lifting device, the first headpiece being supported by a second headpiece which is situated at the side of the centering plate, the second headpiece being comprised of a second lifting device for shifting the first headpiece transversely to the centering plate and transversely to the first direction.

An embodiment of the invention is described in greater detail below, with reference to the single drawing which shows a mounting head with its respective support in a perspective view.

The mounting head has a pair of jaws 1, 2 between which a mounting tongue 3 is located. The two jaws 1, 2 and the mounting tongue 3 are located on a first headpiece 4. Tongue 3 has at least one intake port 6 by means of which an electronic component can be held on tongue 3. The first headpiece is provided with a first lifting device with which tongue 3 can be moved in direction of arrow 7. The centering plate can have a guide slot 17 in its outer edge, which can interact with and locate the socket relative to the jaws.

The first headpiece 4 is retained on a pneumatic plunger 8 of a pneumatic cylinder which is part of a second headpiece 9. This plunger 8 extends at right angles to the centering plate 5 and at right angles to the guide motion direction 7 of tongue 3. The first headpiece 4 can be moved in the direction of arrow 10 by means of plunger 8. Furthermore, plunger 8 is rotatable about its axis to a limited extent, as indicated by arrow 11.

The second headpiece 9 is retained on a further pneumatic plunger 13 of a pneumatic cylinder which is part of a support 14. This plunger 13 extends at right angles to plunger 8. By means of plunger 13, the second headpiece 9 can be shifted in the direction of arrow 15. Moreover, plunger 13 can be rotated about its axis to a limited extent, as indicated by arrow 16.

In the starting position, plungers 8 and 13 are retracted so that the second headpiece 9 abuts against support 14 and the first headpiece 4 abuts against the second headpiece 9. Tongue 3 holds an electronic component by means of its intake port 6. Support 14 is then shifted in direction of a component socket and plungers 8, 13 are then actuated, as a result of which jaws 1 and 2 come to rest against the longitudinal side of the socket and the centering plate 5 comes to rest against the front side of the socket. As a result of the rotatability in the direction of arrows 11 and 16, the first headpiece 4 is centered relative to the socket. At the end of this centering action, tongue 3 is then extended in the direction of arrow 7, as a result of which the component is transferred to the socket.

The pressure exerted by the plunger 13 is adjustable, whereby the force with which the jaws 2, 3 rest against the socket is also adjustable.

I claim:

1. A mounting head for fitting a socket with an electronic component comprising a mounting tongue located between two jaws having at least one intake port for holding a component, a first lifting device for shifting the mounting tongue between the two jaws in a first direction, a first supporting headpiece for the jaws which is movable in said first direction toward the socket until the jaws come to rest against the socket after which the tongue may be shifted in the direction of the socket, a centering plate extending transversely to the jaws retained on the first headpiece together with the jaws and tongue, said headpiece being comprised of the first lifting device, the first headpiece being supported by a second headpiece which is situated at the side of the centering plate, the second headpiece being comprised of a second lifting device for shifting the first headpiece transversely to the centering plate and transversely to said first direction.

2. A mounting head as defined in claim 1, including means for limited pivoting of the first headpiece about an axis of displacement thereof relative to the second headpiece.

3. A mounting head as defined in claim 2, including means for limiting pivoting of the second headpiece about an axis of displacement thereof relative to a support for the second headpiece.

4. A mounting head as defined in claim 3, said support being comprised of a third lifting device for shifting the second headpiece in said first direction.

5. A mounting head as defined in claim 4, in which the first and second headpieces and the support are arranged relative to one another in the shape of an L.

6. A mounting head as defined in claim 5, in which the jaws together with the centering plate and the tongue, and the first and the second headpieces are arranged relative to one another in the shape of an L.

7. A mounting head as defined in claim 1, including pivoting means for limiting pivoting of the second headpiece about an axis of displacement thereof relative to a support for the second headpiece.

8. A mounting head as defined in claim 3, said support being comprised of a third lifting device for shifting the second headpiece in said first direction.

9. A mounting head as defined in claim 8, in which the first and second headpieces and the support are arranged relative to one another in the shape of an L.

10. A mounting head as defined in claim 9, in which the jaws together with the centering plate and the tongue, and the first and the second headpieces are arranged relative to one another in the shape of an L.

11. A mounting head as defined in claim 7, in which the first and second headpieces and the support are arranged relative to one another in the shape of an L.

12. A mounting head as defined in claim 11, in which the jaws together with the centering plate and the tongue, and the first and the second headpieces are arranged relative to one another in the shape of an L.

13. A mounting head as defined in claim 1, in which the centering plate has a guide slot in its outer edge.

14. A mounting head as defined in claim 1, each of the lifting devices being comprised of a pneumatic cylinder with a plunger.

15. A mounting head as defined in claim 14, including means for limited pivoting of the first headpiece about the plunger axis of the pneumatic cylinder in the second headpiece and means for limited pivoting of the second headpiece about the plunger axis of the pneumatic cylinder in a support for the second headpiece.

16. A mounting head as defined in claim 2, each of the lifting devices being comprised of a pneumatic cylinder with a plunger.

17. A mounting head as defined in claim 16, including means for limited pivoting of the first headpiece about the plunger axis of the pneumatic cylinder in the second headpiece and means for limited pivoting of the second headpiece about the plunger axis of the pneumatic cylinder in a support for the second headpiece.

18. A mounting head as defined in claim 3, each of the lifting devices being comprised of a pneumatic cylinder with a plunger.

19. A mounting head as defined in claim 18, including means for limited pivoting of the first headpiece about the plunger axis of the pneumatic cylinder in the second headpiece and means for limited pivoting of the second headpiece about the plunger axis of the pneumatic cylinder in said support.

20. A mounting head as defined in claim 5, each of the lifting devices being comprised of a pneumatic cylinder with a plunger.

21. A mounting head as defined in claim 20, including means for limited pivoting of the first headpiece about the plunger axis of the pneumatic cylinder in the second headpiece and means for limited pivoting of the second headpiece about the plunger axis of the pneumatic cylinder in said support.

* * * * *